United States Patent [19]
Kohno

[11] Patent Number: 5,469,107
[45] Date of Patent: Nov. 21, 1995

[54] MICROWAVE AMPLIFIER

[75] Inventor: Masaki Kohno, Itami, Japan

[73] Assignee: Mitsubishi Denki Kabushiki Kaisha, Tokyo, Japan

[21] Appl. No.: 94,302

[22] Filed: Jul. 21, 1993

[30] Foreign Application Priority Data

Jul. 22, 1992 [JP] Japan .................................. 4-194392

[51] Int. Cl.⁶ .............................. H03F 1/02; H03F 3/60
[52] U.S. Cl. ...................... 330/277; 330/286; 330/302; 330/303; 330/306
[58] Field of Search ................... 330/277, 286, 330/302, 303, 306; 257/621, 698, 699, 784, 724; 437/211, 107, 902

[56] References Cited

U.S. PATENT DOCUMENTS

| | | | |
|---|---|---|---|
| 4,658,220 | 4/1987 | Heston et al. | 330/277 |
| 4,859,633 | 8/1989 | Bayraktaroglu | 437/211 |
| 5,023,993 | 7/1991 | Fengelly | 29/843 |
| 5,146,178 | 9/1992 | Nojima et al. | 330/251 |

FOREIGN PATENT DOCUMENTS

| | | | |
|---|---|---|---|
| 1117958 | 5/1986 | Japan . | |
| 0274806 | 11/1987 | Japan | 330/277 |
| 63-185207 | 7/1988 | Japan . | |
| 1090718 | 5/1992 | Japan . | |
| 0516134 | 5/1992 | Japan | 330/277 |

OTHER PUBLICATIONS

Miller et al, "7-18 GHz GaAs FET Monolithic Power Amplifiers", GaAs IC Symposium, Nov. 1982, pp. 139–141.

*Primary Examiner*—William L. Sikes
*Assistant Examiner*—Fetsum Abraham
*Attorney, Agent, or Firm*—Leydig, Voit & Mayer

[57] ABSTRACT

A microwave amplifier includes a field effect transistor having its source grounded. The drain of the transistor is connected through a first inductor of gold wires to an output-side matching circuit, while the gate of the transistor is connected through a second inductor of gold wires to an input-side matching circuit. A series circuit including a capacitor and a third inductor is disposed near the input-side matching circuit and is connected between the junction of the input-side matching circuit and the second inductor and a reference potential.

3 Claims, 4 Drawing Sheets

MICROWAVE AMPLIFIER

The present invention relates to a microwave amplifier and method of making it.

BACKGROUND OF THE INVENTION

Conventional microwave amplifiers include an internally matched microwave amplifier. The internally matched microwave amplifier includes a package within which housed are a high-power field effect transistor for amplifying microwave signals, an input-side matching circuit connected to the input of the field effect transistor, and an output-side matching circuit connected to the output of the field effect transistor. The input-side matching circuit is for matching the input impedance of the field effect transistor with the impedance of a signal source external to the package, and the output-side matching circuit is for matching the output impedance of the field effect transistor with the impedance of a load external to the package.

As shown in an equivalent circuit in FIG. 1, such a microwave amplifier includes a high power field effect transistor 10 for microwave signals. Transistor 10 has its source grounded, has its drain connected through an inductor 12 to an output-side matching circuit 14, and has its gate connected through an inductor 16 to an input-side matching circuit 18.

FIG. 2 schematically shows an arrangement of the microwave amplifier of FIG. 1 within a package. In FIG. 2, output-side matching circuit 14 and input-side matching circuit 18 are separate from field effect transistor 10 and are disposed on substrates 20 and 22, respectively, with the drain of transistor 10 connected to output-side matching circuit 14 by means of a plurality of gold wires 12a which serve as inductor 12, with the gate of transistor 10 connected to input-side matching circuit 18 by means of a plurality of gold wires 16a which serve as inductor 16.

Field effect transistor 10 has a large gate width in order to provide a high power output, i.e. large drain current, and, accordingly, its gate-source capacitance is large and its gate-source resistance value is small. Thus, the input impedance, i.e., the impedance exhibited between the gate and the source, is capacitive, and has a small value, e.g. 0.2–0.3 Ω. It is, therefore, necessary to match this input impedance with the impedance of, for example, 50 Ω of a circuit to be connected to the input-side of the microwave amplifier. For that purpose, the number of gold wires 16a is adjusted to adjust the inductance value of inductor 16 between input-side matching circuit 18 and the gate of field effect transistor 10 so as to cancel the capacitive component of the input impedance as much as possible, before the input impedance of the amplifier circuit is matched with the impedance of the circuit connected to the input-side by input-side matching circuit 18.

When such a microwave amplifier is used in a wide band, e.g. within a range of from 3 GHz to 12 GHz, the impedance of inductor 16 provided by gold wires 16a will vary with the frequency of an input signal and the impedance observed from the junction between input-side matching circuit 18 and inductor 16 toward field effect transistor 10 varies with the input signal frequency. Thus, it is impossible for the microwave amplifier to have a flat frequency response characteristic and a high gain.

SUMMARY OF THE INVENTION

A microwave amplifier according to the present invention includes a field effect transistor having a source, a drain, and a gate, with the source connected to a point of reference potential, an output-side matching circuit connected to the drain of the field effect transistor, an input-side matching circuit connected to the gate of the transistor via wiring, and a series combination of a capacitor and an inductor connected between the junction of the input-side matching circuit and the wiring and the point of reference potential.

The input-side matching circuit, the field effect transistor, the wiring, and the output-side matching circuit may be disposed within a package. The input-side matching circuit may be disposed on a substrate on which the capacitor of the series combination may be also disposed. The reference potential may be established at a location in the vicinity of the portion of the substrate where the capacitor is disposed, and the capacitor and the point of reference potential are connected by means of wiring different from the wiring acting as the inductor of the series combination. The capacitor may be disposed on the substrate near the field effect transistor.

A method of manufacturing a microwave amplifier according to the present invention includes a first step of forming an input-side matching circuit and a reference potential section to be connected to a reference potential on a substrate, a second step of forming a capacitor forming element in the input-side matching circuit, and a third step of connecting to the reference potential, a source of a field effect transistor having a source, a gate and a drain, connecting the gate of the transistor to the input-side matching circuit by means of first wiring, and connecting the capacitor forming element to the reference potential section by means of second wiring.

The third step may be carried out after disposing the input-side matching circuit and the field effect transistor within one metallic package. Furthermore, in the second step, a dielectric material may be deposited at a location of the input-side matching circuit near the field effect transistor with an electrode disposed on the dielectric material.

DETAILED DESCRIPTION OF THE INVENTION

Figure 1:
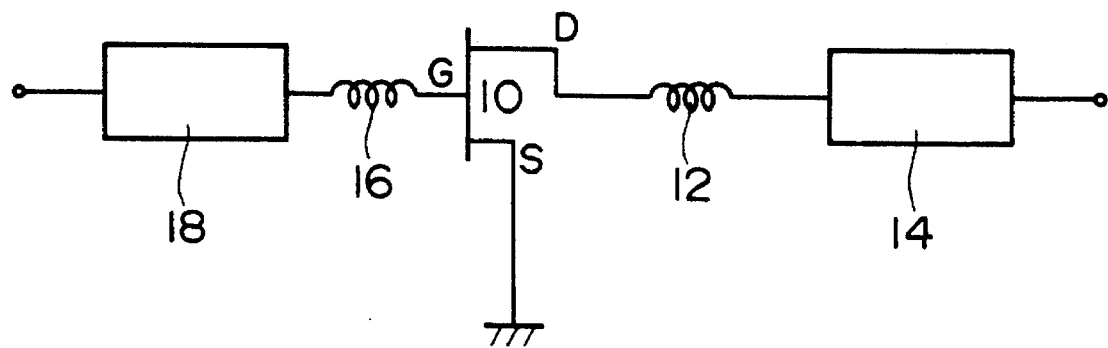
FIG. 1 is a circuit diagram of a conventional microwave amplifier.
Figure 2:
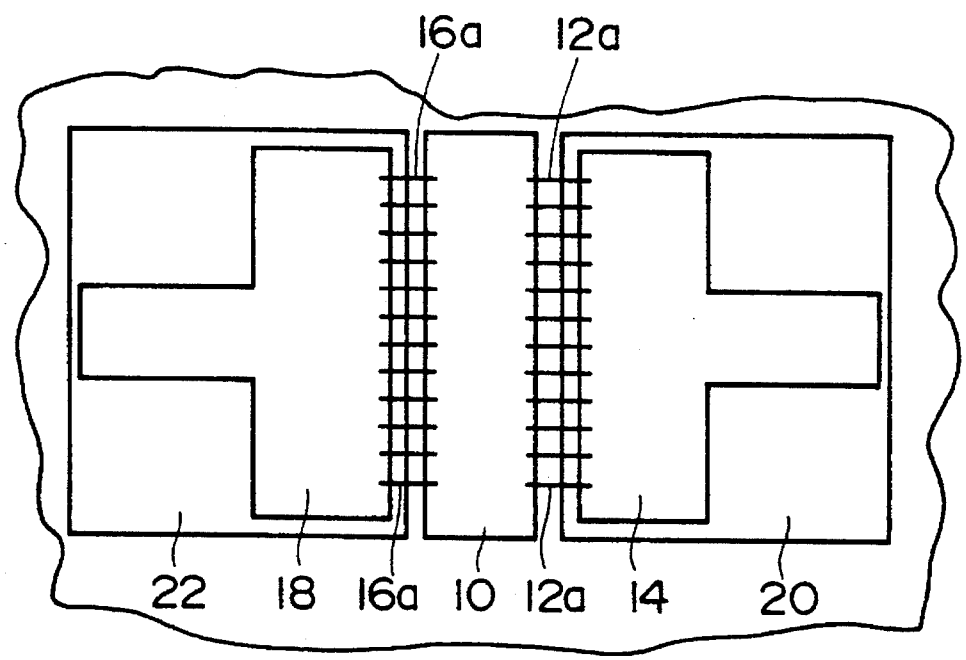
FIG. 2 is a simplified plan view of a portion of a microwave amplifier package corresponding to the arrangement shown in FIG. 1.
Figure 3:
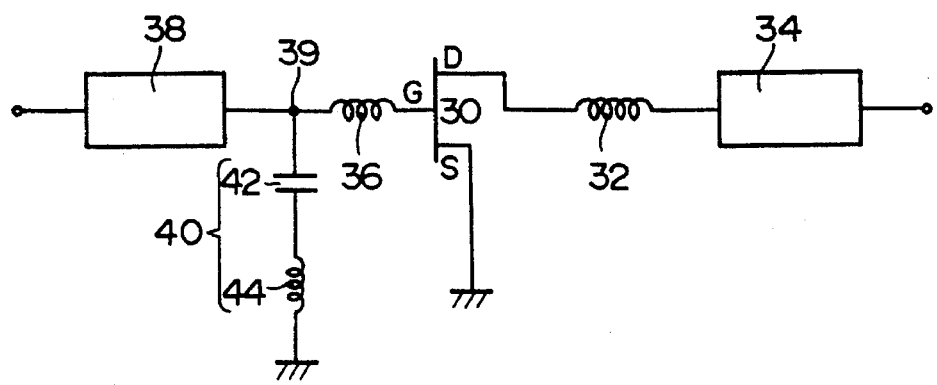
FIG. 3 is a circuit diagram of a microwave amplifier according to one embodiment of the present invention.
Figure 4:
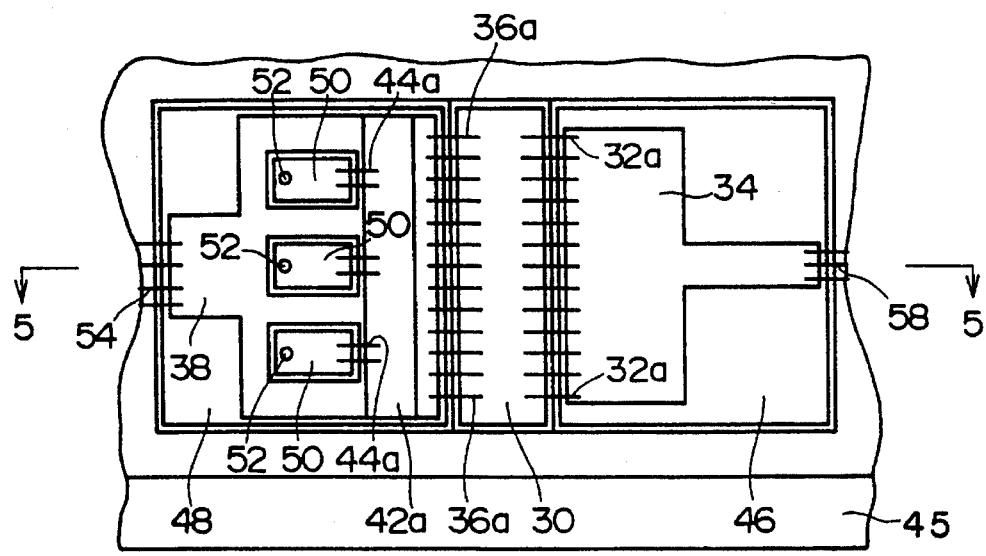
FIG. 4 is a plan view of part of a packaged microwave amplifier corresponding to the arrangement shown in FIG. 3.
Figure 5:
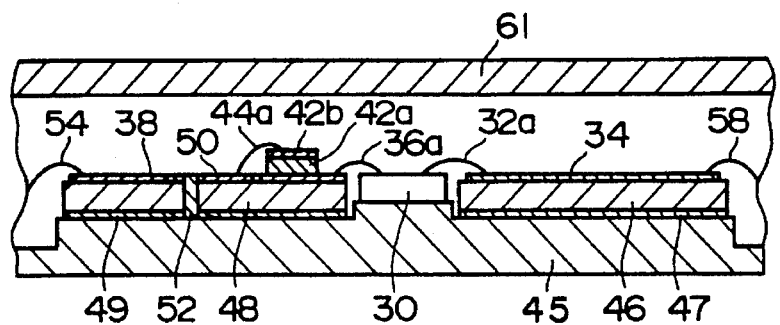
FIG. 5 is a cross-section view along line 5—5 in FIG. 4.

As shown in FIGS. 3, 4, and 5 a microwave amplifier of the present invention includes a microwave high power field effect transistor (FET) 30. FET 30 has its source connected to a reference potential, and has its drain connected through an inductor 32 to an output-side matching circuit 34.

The gate of FET 30 is connected through an inductor 36 to an input-side matching circuit 38. A series circuit 40 is connected between a junction 39 of input-side matching circuit 38 and inductor 36 and the reference potential. Series circuit 40 includes a series combination of a capacitor 42 connected to junction 39 and an inductor 44 connected to the reference potential.

FET 30, output-side matching circuit 34, input-side matching circuit 38 and other components are disposed within a metallic package 45. FET 30 has its source disposed on its bottom side, which is contacted with the package 45 so that the source is connected to a reference potential.

Output-side matching circuit 34 is disposed on the upper surface of a substrate 46. Output-side matching circuit 34 is connected to the drain of FET 30 by means of a plurality of gold wires 32a which serve as inductor 32. Disposed over the entire bottom surface of substrate 46 is a reference potential plane 47 which is in contact with package 45.

Input-side matching circuit 38 is also disposed on the upper surface of another substrate 48. In input-side matching circuit 38, at points along the edge closest to the gate of FET 30, a plurality of gold wires 36a serving as inductor 36 are connected.

Capacitor 42 is disposed near the locations where gold wires 36a are connected to input-side matching circuit 38. Capacitor 42 has a capacitor-forming element including a dielectric 42a disposed on the upper surface of input-side matching circuit 38 and a gold-plated electrode 42b disposed on dielectric 42a. The portion of input-side matching circuit 38 which contacts dielectric 42a serves as the other electrode of capacitor 42. This arrangement in which part of input-side matching circuit 38 is used as one electrode of capacitor 42 enables easy fabrication of capacitor 42.

At locations within an area where input-side matching circuit 38 is disposed and near capacitor 42, three island-shaped reference potential sections 50 are disposed, isolated from input-side matching circuit 38. Reference potential sections 50 are connected through via-holes 52 in substrate 48 to a reference potential plane 49 disposed over the entire bottom surface of substrate 48. Reference potential plane 49 is in contact with package 45. Capacitor 42 is connected to reference potential sections 50 by means of a plurality of gold wires 44a which serve as inductor 44. Because reference potential sections 50 to which wires 44a are connected are disposed near capacitor 42, the inductance provided by wires 44a is prevented from becoming undesirably large.

FET 30, inductor 36, a series circuit 40, input-side matching circuit 38, inductor 32, and an output-side matching circuit 34 form a set, and a plurality of such sets may be disposed within package 45, if necessary. Respective input-side matching circuits 38 are connected in parallel by means of gold wires 54 and input-side combining patterns (not shown). Similarly, respective output-side matching circuits 34 are connected in parallel by means of gold wires 58 and output-side combining patterns (not shown). Package 45 is covered by a cap 61.

Figures 6A, 6B:
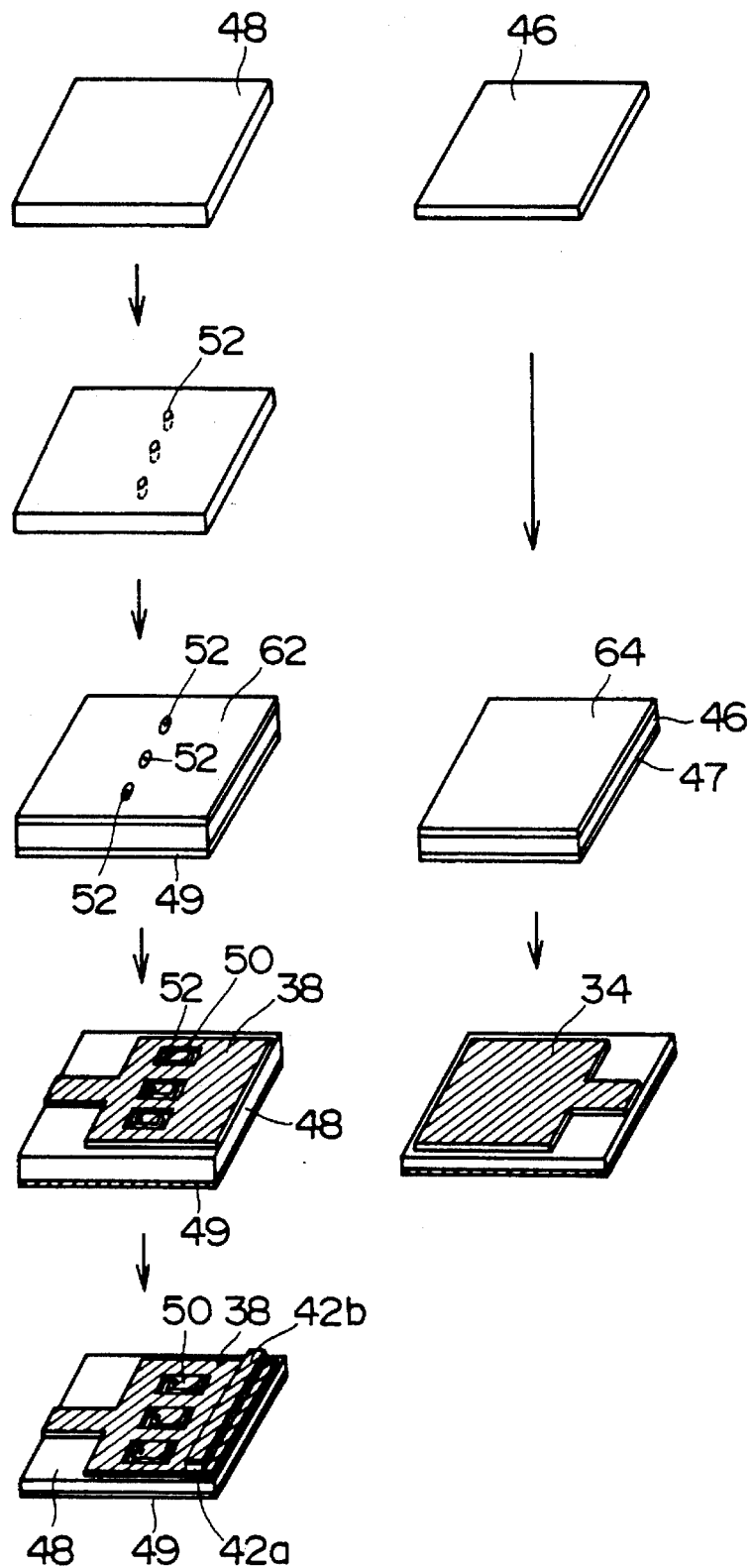
FIG. 6A and 6B shows how the microwave amplifier shown in FIG. 3 may be manufactured.

This microwave amplifier may be fabricated as follows. As shown in FIG. 6(a), through-holes 52 are formed at prescribed location in substrate 48. Thereafter, the top and bottom surfaces of substrate 48 and the inner surfaces of through-holes 52 are plated with gold to provide reference potential plane 49 on the bottom surface and a conductive layer 62 on the top surface. Reference potential sections 50 and input-side matching circuit 38 are formed from conductive layer 62. Conductive layer 62 is appropriately patterned and etched by suitable techniques to form input-side matching circuit 38 and reference potential sections 50. Then, dielectric 42a is formed by sputtering and plated with gold to form an electrode 42b, which provides capacitor 42.

Further, as shown in FIG. 6(b), the top and bottom surfaces of substrate 46 are plated with gold, which provides reference potential plane 47 on the bottom surface and a conductive layer 64 on the top surface from which output-side matching circuit 34 is formed. Conductive layer 64 is patterned and etched appropriately by suitable techniques to form output-side matching circuit 34.

Substrate 48 on which input-side matching circuit 38 and other components are disposed, substrate 46 on which output-side matching circuit 34 is disposed, and FET 30 which has been fabricated separately, are arranged within and bonded to package 44, as shown in FIG. 5. Thereafter, the drain of FET 30 is connected by gold wires 32a to output-side matching circuit 34, the gate of FET 30 is connected by means of gold wires 36a to input-side matching circuit 38, and electrode 42b of capacitor 42 is connected by gold wires 44a to reference potential sections 50. Input-side matching circuit 38 is connected further to the input-side combining patterns by gold wires 54, and output-side matching circuit 36 is connected to the output-side combining patterns by gold wires 58. A plurality of such sets may be similarly disposed within single package 45, if necessary.

Figure 7:
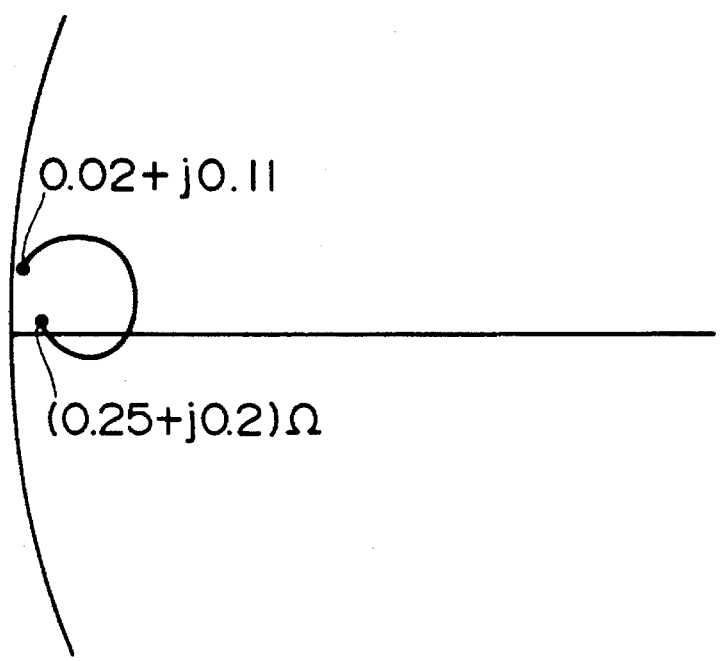
FIG. 7 shows the impedance observed from a node 39 toward a field effect transistor of the microwave amplifier of FIG. 3 as a function of the frequency of an input signal to the field effect transistor.

FIG. 7 shows a Smith chart on which the input impedance of the circuit observed from junction 39 toward FET 30 as a function of the frequency of an input signal of from f1 (3.0 GHz) to f2 (12.0 GHz) is plotted. In this case, FET 30 has a total gate width of 12.6 mm, inductors 36 and 32 have inductance of about 0.05 nH, inductor 44 has inductance of about 0.04 nH, and capacitor 42 has capacitance of about 600 pF.

The input impedance is about $(0.02+j0.11)$ D at f1, and is about $(0.25+j0.2)\Omega$ at f2. The impedance varies substantially circularly with variations in frequency of the input signal. That is, variations in absolute value of the impedance are small, and the impedance is always inductive. This means that input-side matching circuit 38 is easily designed and that the microwave amplifier is provided with a substantially constant frequency characteristic.

Figure 8:
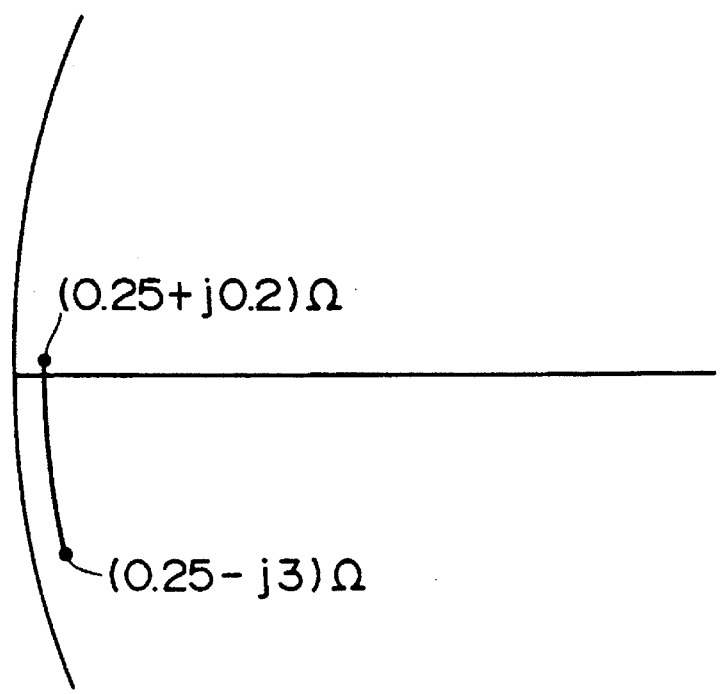
FIG. 8 shows variations of the impedance observed from the node 39 toward the field effect transistor of the microwave amplifier of FIG. 3 with an inductor and a capacitor removed, as a function of the frequency of an input signal to the field effect transistor.

FIG. 8 also shows a Smith chart similar to the one shown in FIG. 7, except inductor 44 and capacitor 42 are removed from the circuit. The input impedance varies from about $(0.25-j3)$ $\Omega$ at f1 to about $(0.25+j0.2)$ $\Omega$ at f2. That is, the absolute value of the impedance varies greatly, and the impedance varies between being capacitive and being inductive. Accordingly, it is difficult to design the input-side matching circuit 38, and the frequency characteristic of such a microwave amplifier cannot be flat.

What is claimed is:

1. A microwave amplifier comprising:

a field effect transistor having a source, a drain, and a gate;

a first substrate having metallized front and rear surfaces, an output-side matching circuit disposed on the front surface of said first substrate and connected by first wires to the drain of said field effect transistor said the first wires having an inductance;

a second substrate having metallized front and rear surfaces, an input-side matching circuit disposed on the front surface of said second substrate and connected to the gate of said field effect transistor by second wires, said second wires having inductance wherein the metallized front surface of said second substrate includes a metallized area connected to the gate electrode of said field effect transistor by said second wires and a metallized region surrounded by and electrically isolated from the metallized area and including a via hole electrically connecting the metallized region to the metallized rear surface of said second substrate;

a third substrate including a metallized front surface and a non-metallized rear surface mounted on the metallized area on the front surface of said second substrate adjacent the metallized region; providing a capacitance; and at least one third wire having an inductance and electrically connecting the metallized region on the front surface of said second substrate to the metallized front surface of said third substrate to which said second wires are connected, thereby providing a series circuit including the capacitance and the inductance of said third wire with the capacitance connected to a junction of said input-side matching circuit and said second wires and the inductance of said third wire is connected to the metallized rear surface of said second substrate through said via hold, the metallized rear surface of said second substrate representing system ground.

2. The microwave amplifier according to claim 1 including a package within which said field effect transistor and said first, second, and third substrates are disposed.

3. The microwave amplifier according to claim 2 wherein said package is metallic and includes a protrusion on which said field effect transistor is mounted, said first and second substrates being disposed on opposite sides of the protrusion with the metallized rear surfaces of said first and second substrates electrically connected to said package.

* * * * *

UNITED STATES PATENT AND TRADEMARK OFFICE
CERTIFICATE OF CORRECTION

PATENT NO. : 5,469,107
DATED : November 21, 1995
INVENTOR(S) : Kohno

It is certified that error appears in the above-indentified patent and that said Letters Patent is hereby corrected as shown below:

Column 4, Line 61, after "transistor" insert --,--;

delete "the" (second occurrence);

Line 67, after "having" insert --an--;

Column 5, Line 11, change ";" to --,thereby--;

Column 6, Line 3, delete "is";

Line 5, change "hold" to --hole--.

Signed and Sealed this

Twenty-eighth Day of October, 1997

Attest:

BRUCE LEHMAN

*Attesting Officer*   Commissioner of Patents and Trademarks